United States Patent
Kawamoto

(10) Patent No.: US 6,835,625 B2
(45) Date of Patent: Dec. 28, 2004

(54) METHOD FOR FABRICATING SEMICONDUCTOR DEVICE

(75) Inventor: Tomokazu Kawamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/673,565

(22) Filed: Sep. 30, 2003

(65) Prior Publication Data

US 2004/0115871 A1 Jun. 17, 2004

(30) Foreign Application Priority Data

Oct. 2, 2002 (JP) .................................. 2002-289938

(51) Int. Cl.$^7$ .......................................... H01L 21/336
(52) U.S. Cl. ...................... 438/299; 438/301; 438/308; 438/770
(58) Field of Search ........................ 438/769, 770, 438/299, 301, 308, 795

(56) References Cited

U.S. PATENT DOCUMENTS

| | | | | |
|---|---|---|---|---|
| 4,434,013 A | * | 2/1984 | Bol | 438/181 |
| 4,621,413 A | * | 11/1986 | Lowe et al. | 438/301 |
| 4,727,044 A | * | 2/1988 | Yamazaki | 438/166 |
| 5,399,506 A | * | 3/1995 | Tsukamoto | 438/301 |
| 6,555,439 B1 | * | 4/2003 | Xiang et al. | 438/305 |
| 6,582,998 B2 | * | 6/2003 | Nitta | 438/217 |
| 6,583,016 B1 | * | 6/2003 | Wei et al. | 438/303 |
| 2003/0003668 A1 | * | 1/2003 | Oh | 438/299 |

FOREIGN PATENT DOCUMENTS

| | | |
|---|---|---|
| JP | 7-272990 | 10/1995 |
| JP | 2000-114197 | 4/2000 |
| JP | 2000-277449 | 10/2000 |
| JP | 2001-7220 | 1/2001 |
| JP | 2001-297996 | 10/2001 |

* cited by examiner

Primary Examiner—Tuan H. Nguyen
(74) Attorney, Agent, or Firm—Westerman, Hattori, Daniels & Adrian, LLP

(57) ABSTRACT

The method for fabricating a semiconductor device comprises the step of: forming a gate electrode on a semiconductor substrate with a gate insulation film formed therebetween; the step of implanting a dopant in the semiconductor substrate with the gate electrode as a mask to form a dope region in the semiconductor substrate; the step of forming a chemical oxide film on the doped region, which prevents the dopant implanted in the doped region from diffusing outside the semiconductor substrate; and the step of performing thermal processing for activating the dopant implanted in the doped region.

9 Claims, 6 Drawing Sheets

METHOD FOR FABRICATING SEMICONDUCTOR DEVICE

CROSS-REFERENCE TO RELATED APPLICATION

This application is based upon and claims priority of Japanese Patent Application No. 2002-289938, filed on Oct. 2, 2002, the contents being incorporated herein by reference.

BACKGROUND OF THE INVENTION

The present invention relates to a method for fabricating a semiconductor device, more specifically a method for fabricating a semiconductor device having the step of activating a dopant by thermal processing.

The recent micronization of semiconductor devices makes it necessary that semiconductor device of MOS (Metal Oxide Semiconductor) transistors, etc. have shallow junctions. To this end, as a method of activation annealing following ion implantation of a dopant, RTA (Rapid Thermal Annealing) is used. RTA activates a dopant as much as possible by high-temperature heat processing in a short period of time while suppressing the diffusion of the dopant, whereby a lightly doped diffused layer is made thinner in a required concentration.

For example, in the MOS transistor fabricating process, a dopant is activated by RTA as the thermal processing in forming the lightly doped diffused layer of an LDD (Lightly Doped Drain) structure.

However, the micronization, etc. of semiconductor devices have thinned the gate insulation film in MOS transistor fabricating process. In order to suppress the generation of bird's beaks, the step of forming an oxide film for covering the surface of the substrate when ion implantation is performed tends to be omitted. Accordingly, in the thermal processing by RTA, out diffusion of an implanted dopant often takes place. The out diffusion of a dopant causes disadvantages of increase, deflection, etc. of the resistance of the shallow junction.

As a method for suppressing such out diffusion of a dopant, thermal processing is performed, e.g., by RTA in an oxygen added-atmosphere to thereby activate the dopant is proposed (refer to, e.g., Japanese Patent Application Unexamined Publication No. 2000-114197). In this method, an oxide film is formed on a semiconductor substrate surface by rapid temperature increase in an oxygen added-atmosphere, whereby a dopant is activated while the out diffusion of the dopant can be suppressed.

Various methods for suppressing the out diffusion of a dopant by an oxide film formed by the thermal processing are proposed (refer to, e.g., Japanese Patent Application Unexamined Publication No. 2000-277449 and Japanese Patent Application Unexamined Publication No. 2001-7220).

However, the above-described method, in which the temperature is rapidly increased in an oxygen added-atmosphere, can form an oxide film for suppressing the out diffusion but will often generate bird's beaks in gate electrodes. Influences produced by such birds' beaks will be unignorable as semiconductor devices are increasingly micronized. Even when the out diffusion of a dopant can be suppressed by an oxide film formed by thermal processing in an oxygen added-atmosphere, the bird's beaks generated in the gate electrodes simultaneously with the formation of the oxide film, which will resultantly cause deterioration of the transistor characteristics.

SUMMARY OF THE INVENTION

An object of the present invention is to provide a method for fabricating a semiconductor device which, when a dopant is activated by thermal processing, can suppress the generation of bird's beaks while suppressing the out diffusion of the dopant.

According to one aspect of the present invention, there is provided a method for fabricating a semiconductor device comprising the steps of: forming a gate electrode on a semiconductor substrate with a gate insulation film formed therebetween; implanting a dopant in the semiconductor substrate with the gate electrode as a mask to form a doped region in the semiconductor substrate; forming a chemical oxide film on the doped region, which prevents the dopant implanted in the doped region from diffusing outside the semiconductor substrate; and performing thermal processing for activating the dopant implanted in the doped region.

According to another aspect of the present invention, there is provided a method for fabricating a semiconductor device comprising the steps of: forming a gate electrode on a semiconductor substrate with a gate insulation film formed therebetween; implanting a dopant in the semiconductor substrate with the gate electrode as a mask to form a doped region in the semiconductor substrate; forming an oxide film by chemical vapor deposition at a film forming temperature of 250–500° C. on the doped region, which prevents the dopant implanted in the doped region from diffusing outside the semiconductor substrate; and performing thermal processing for activating the dopant implanted in the doped region.

As described above, according to the present invention, the gate electrode is formed on a semiconductor substrate with the gate insulation film formed therebetween, a dopant is implanted in the semiconductor substrate with the gate electrode as mask to form the doped region in the semiconductor substrate, the chemical oxide film which prevents the out diffusion of the dopant implanted in the doped region is formed on the doped region, and the thermal processing for activating the dopant implanted in the doped region is performed, whereby the out diffusion of the dopant implanted in the doped region can be suppressed. Thus, the doped diffused layer can have low resistance and the resistance value which is stable, whereby semiconductor devices of high reliability can be provided.

The thermal oxidation for activating the dopant implanted in the doped region is performed in an atmosphere containing no oxygen, whereby the generation of bird's beaks in the gate electrode area can be suppressed.

DETAILED DESCRIPTION OF THE INVENTION

Figure 1:
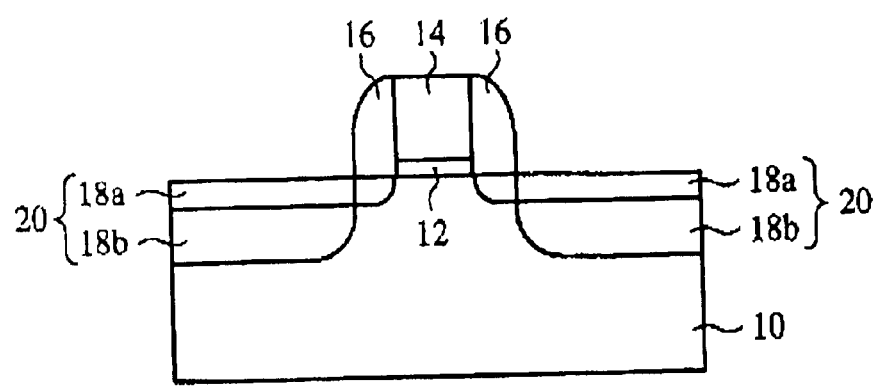
FIG. 1 is a sectional view of a MOS transistor fabricated by the method for fabricating the semiconductor device according to one embodiment of the present invention, which shows a structure thereof.

The method for fabricating a semiconductor device according to one embodiment of the present invention will be explained with reference to FIGS. 1, 2A–2C, 3A–3C, 4 and 5. FIG. 1 is a sectional view of a MOS transistor fabricated by the method for fabricating a semiconductor device according to the present embodiment, which shows the structure thereof. FIGS. 2A–2C, 3A–3C and 4A–4C are sectional views of the semiconductor device in the steps of the method for fabricating a semiconductor device according to the present embodiment, which show the method. FIG. 5 is a graph of one example of the relationship between chemical oxide film and the sheet resistance.

The method for fabricating a semiconductor device according to the present embodiment suppresses the out diffusion of a dopant in the activation annealing by RTA by forming a chemical oxide film on a region with the dopant ions implanted in, in steps of fabricating a MOS transistor having a LDD structure.

The MOS transistor fabricated by the method for fabricating a semiconductor device according to the present embodiment will be explained with reference to FIG. 1.

A gate insulation film 12 of a silicon oxide film, and a gate electrode 14 are formed on a silicon substrate 10 in the stated order. Sidewall insulation films 16 are formed on the side walls of the gate electrode 14.

Lightly doped diffused layers 18a are formed in the silicon substrate 10 by lightly implanting a dopant into the silicon substrate 10 by self-alignment with the gate electrode 14. Furthermore, heavily doped diffused layers 18b are formed in the silicon substrate 10 by heavily implanting a dopant into the silicon substrate 10 by self-alignment with the gate electrode 14 formed with sidewall insulation films 16. The lightly doped diffused layer 18a and the heavily doped diffused layer 18b form a source/drain diffused layer 20.

The method for fabricating a semiconductor device according to the present embodiment is mainly characterized in that, in the fabrication process of fabricating the MOS transistor having the above-described LDD structure, a chemical oxide film is formed on the silicon substrate 10 with a dopant implanted in, prior to the step of activating the dopant by the thermal processing using RTA in forming the lightly doped diffused layer 18a. The chemical oxide film can suppress the out diffusion of the dopant when the dopant is activated by the thermal processing using RTA, whereby low resistances and stable resistance values of the shallow junction can be attained. The pre-formation of the chemical oxide film makes it unnecessary to form a thermal oxide film for suppressing the out diffusion of the dopant by the thermal processing in an oxygen-content atmosphere, and accordingly, the generation of bird's beaks can be suppressed.

In this specification, oxide films other than oxide films formed by thermal oxidation and natural oxidation are called "chemical oxide films". The chemical oxide films include oxide films formed e.g., by oxidizing the surfaces of silicon surfaces with oxidizing chemical liquids, the so-called wet oxidation, and by acting oxygen plasmas on silicon surfaces, the so-called plasma oxidation. Oxide films formed by oxidizing methods which can form oxide films in desired design film thicknesses and which seldom generate bird's beaks are not excluded from "the chemical oxide films", because they are expected to produce the same effect as the methods exemplified above.

The method for fabricating a semiconductor device according to the present embodiment will be explained with reference to FIGS. 2A–2C, 3A–3C, 4A–4C and 5.

First, an element region (not shown) is defined on the silicon substrate 10 by, e.g., the usual STI (Shallow Trench Isolation).

Then, the gate insulation film 12 of a 5 nm-thickness silicon oxide film is formed on the surface of the silicon substrate 10 in the element region by, e.g., thermal oxidation.

Figure 2A:
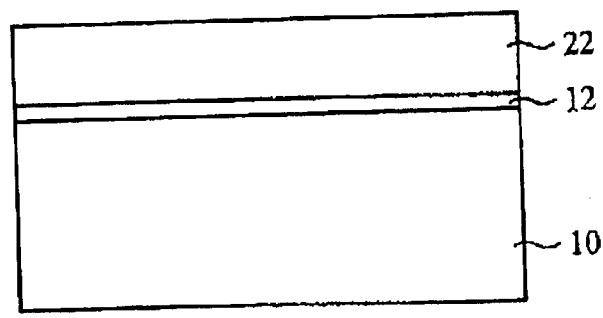
FIGS. 2A–2C are sectional views of the semiconductor device according to one embodiment of the present invention in the steps of the method for fabricating the semiconductor device, which shows the method (Part 1).

Then, a 100 nm-thickness polysilicon film 22 is formed on the entire surface by, e.g., CVD (Chemical Vapor Deposition) (see FIG. 2A).

Figure 2B:
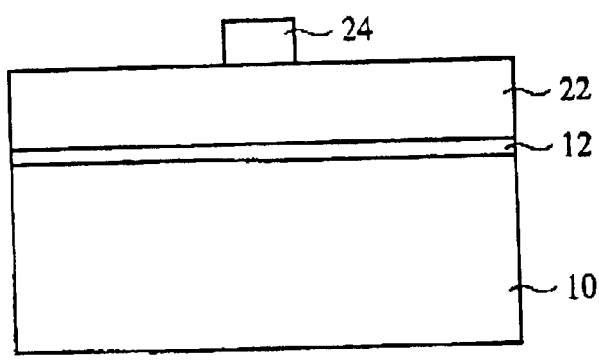
Figure 2C:
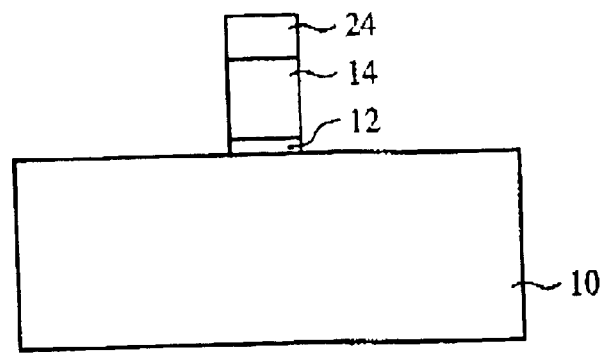

Next, a resist film 24 is formed on the polysilicon film 22 and is left on a region for the gate electrode to be formed in (see FIG. 2B).

Then, with the resist film 24 as a mask, the polysilicon film 22 is patterned by dry etching to form the gate electrode 14 of the polysilicon film 22. At this time, the exposed gate insulation film 12 is also etched thinner. In the case that the gate insulation film 12 is formed in a thin thickness such as e.g., a 3 nm-thickness, the exposed gate insulation film 12 is substantially removed (see FIG. 2C).

Then, with the gate electrode 16 as a mask, B (boron) ions are implanted into the silicon substrate 10 to form by self-alignment with the gate electrode 14 doped regions 26a which is to be the lightly doped diffused layers 18a of the LDD structure (see FIG. 3). Conditions for the ion implantation can be, e.g., a 1–5 keV ion acceleration energy and a $2\times10^{14}$ cm$^{-2}$ dose. When $BF_z$ ions are implanted in place of B ions, the ion acceleration energy is, e.g., about 3–30 keV.

Next, the resist film 24 used as the mask for patterning the gate electrode 14 is removed. The resist film 24 is removed by, e.g., plasma ashing and/or oxidizing chemical liquid processing. In the present embodiment, as will be described below, when the resist film 24 is removed, the chemical oxide film 28 of a prescribed film thickness is formed on the dopant implanted region 26a.

The plasma ashing is performed as follows.

The silicon substrate 10 with the dopant implanted region 26a formed in is exposed to oxygen plasmas or oxygen radicals in an ashing chamber. The ashing conditions can be suitably set. For example, oxygen is introduced into the ashing chanter at a 1350 sccm flow rate to generate oxygen plasmas, and the silicon substrate 10 is exposed to the oxygen plasmas uninterruptedly for 20 seconds at 180° C. and for 25 seconds at 270° C. Otherwise, it is possible that oxygen is introduced into the ashing chamber at a 1350 sccm flow rate to generate oxygen plasmas, and the silicon substrate 10 is exposed to the oxygen plasmas for 60 seconds at 240° C. The silicon substrate 10 may be exposed to reaction species of oxygen other than oxygen plasmas and oxygen radicals.

The resist film 24 on the gate electrode 14 exposed to the oxygen plasmas reacts with the oxygen plasmas to be decomposed and removed. At this time, the surface of the doped region 26a is also exposed to the oxygen plasmas to have the surface oxidized by the oxygen plasmas, and the chemical oxide film 28 is grown on the doped region 26a.

The oxidizing chemical liquid processing is performed as follows.

The silicon substrate 10 with the doped region 26a is formed in is immersed in an oxidizing chemical liquid. Oxidizing chemical liquid used in removing the resist film 24 and growing the chemical oxide film 28 are SPM (Sulfuric Acid/Hydrogen Peroxide Mixture: $H_2SO_4/H_2O_2$ mixed liquid), high-temperature APM (Ammonia/Hydrogen Peroxide Mixture; $NH_4OH/H_2O_2$ mixed liquid), HPM (Hydrochloric Acid/Hydrogen Peroxide/Water Mixture: $HCl/H_2O_2/H_2O$ mixed liquid), aqueous solution of ozone, nitric acid, etc. However, APM reacts with the chemical oxide film 28 at the room temperature to thin the chemical oxide film 28. Accordingly, it is preferable that the processing for removing foreign objects and sulfuric acid flaws with APM of the room temperature is not used at the end of the step of forming the chemical oxide film 28. When the room temperature APM processing is performed at the end of the step of forming the chemical oxide film 28, processing conditions, such as the immersion period of time, etc. must be noted so that the chemical oxide film 28 is not thinned too much but into a desired film thickness. High temperature APM etches the silicon substrate, and it must be noted that high temperature APM causes concentration decrease of the diffused layer.

The resist film 24 on the gate electrode 14 immersed in the oxidizing chemical liquid reacts with the oxidizing chemical liquid to be decomposed and removed. At this time, the surface of the doped region 26a is oxidized by the oxidizing chemical liquid to thereby form the chemical oxide film 28 on the doped region 26a.

After the oxidizing chemical liquid processing is completed, the silicon substrate 10 is dried. In drying the silicon substrate 10, air blow, IPA drying, spin drying, etc., for example, can be used.

Figure 3A:
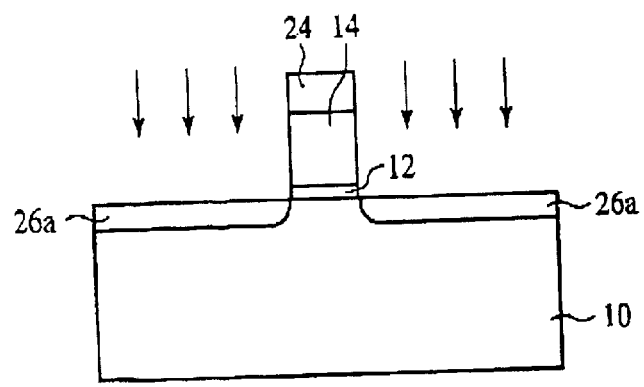
FIGS. 3A–3C are sectional views of the semiconductor device according to one embodiment of the present invention in the steps of the method for fabricating the semiconductor device, which shows the method (Part 2).
Figure 3B:
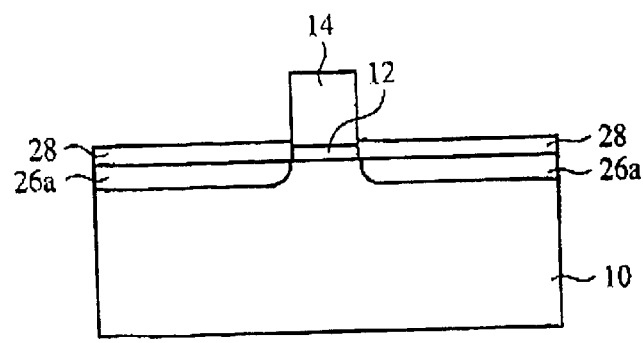
Figure 3C:
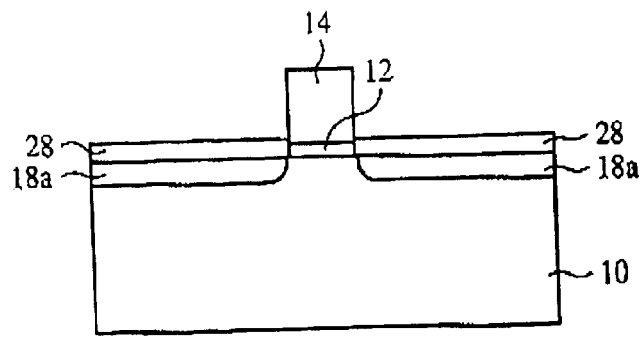

The above-described plasma ashing and/or the processing with various oxidizing chemical liquids grows the chemical oxide film 28 on the doped region 26a finally into a prescribed film thickness when the resist film 24 is removed (see FIG. 3B).

To be specific, for example, a first oxidizing processing with SPM, the plasma ashing and a second oxidizing processing with SPM are uninterruptedly performed in the stated order to thereby form the chemical oxide film 28 when the resist film 24 is removed.

The chemical oxide film 28 may be grown when the resist film 24 is removed singly by the chemical liquid processing without the plasma ashing. In this case, for example, the oxidizing processing with SPM, the oxidizing processing with APM and the oxidizing processing with aqueous solution of ozone are uninterruptedly performed in the stated order. The oxidizing processing with SPM, the oxidizing processing with APM and the oxidizing processing with nitric acid may be uninterruptedly performed in the stated order. The oxidizing processing with SPM and the oxidizing processing with aqueous solution of ozone may be uninterruptedly performed in the stated order. The oxidizing processing with SPM and the oxidizing processing with high temperature APM may be uninterruptedly performed in the stated order. The oxidizing processing with SPM may be singly performed. The oxidizing processing with aqueous solution of ozone may be singly performed.

When the chemical oxide film 28 formed on the doped region 26a is too thin, it is difficult to sufficiently suppress the out diffusion of the dopant. Undesirable results, such as resistance increase, resistance value deflection, etc. at the junction are caused. Thus, it is desirable to form the chemical oxide film 28 having the thickness sufficiently controlled.

The thickness of the chemical oxide film 28 can be controlled by suitably setting conditions of the ashing and the conditions of the oxidizing chemical liquid processing.

A thickness of the chemical oxide film 28 which can sufficiently suppress the out diffusion of the dopant can be determined by measuring the relationship between the film thickness of the chemical oxide film and the sheet resistance.

FIG. 5 is a graph of one example of the relationship between the film thickness of the chemical oxide film formed on a silicon wafer and the sheet resistance. The sheet resistance was measured by four-terminal method on silicon wafers with the chemical oxide film of prescribed film thicknesses formed on by the above-described method and a dopant activated by thermal processing using RTA.

Based on the graph of FIG. 5, it can be seen that the sheet resistance decreases as the thickness of the chemical oxide film increases. For example, the chemical oxide film of a 1.4 nm thickness or above can sufficiently decrease the sheet resistance. Accordingly, the chemical oxide film 28 is formed in a 1.4 nm-thickness or above/whereby the out diffusion of the dopant can be sufficiently suppressed, and the low resistance of the junction can be attained.

As described above, a film thickness of the chemical oxide film 28 to be formed on the doped region 26a is determined based on the relationship between the thickness of the chemical oxide film 28 and the sheet resistance given in advance, whereby the out diffusion of the dopant can be suppressed without failure.

The chemical oxide film 28 is formed in a prescribed film thickness thus given, and a dopant implanted in the doped region 26a is activated by the thermal processing using RTA. Conditions for the RTA thermal processing can be, e.g., a nitrogen atmosphere, 1000° C. heating temperature and 10 seconds of heating time. The dopant in the doped region 26a is thus activated, whereby the lightly doped diffused layer 18a can be formed (see FIG. 3C).

In the thermal processing using RTA, the chemical oxide film 28 formed on the doped region 26a suppresses the out diffusion of the dopant in the doped region 26a.

Preferably, the thermal processing using RTA is performed in an atmosphere containing no oxygen. The thermal processing using RTA in an atmosphere containing no oxygen can suppress the generation of bird' beaks in the gate electrode 14 area.

Figure 4A:
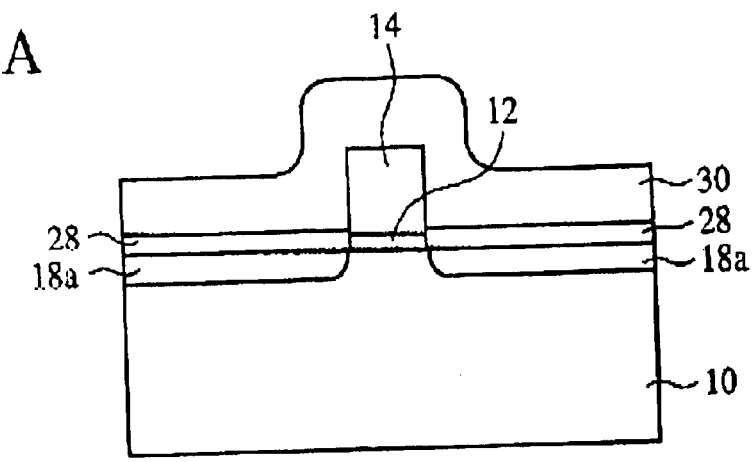
FIGS. 4A–4C are sectional views of the semiconductor device according to one embodiment of the present invention in the steps of the method for fabricating the semiconductor device, which shows the method (Part 3).
Figure 4B:
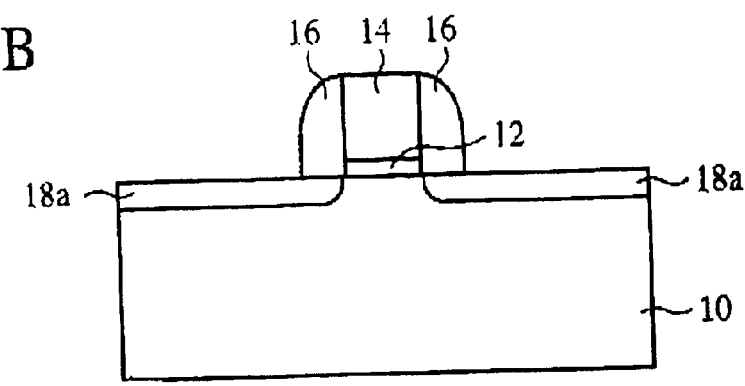
Figure 5:
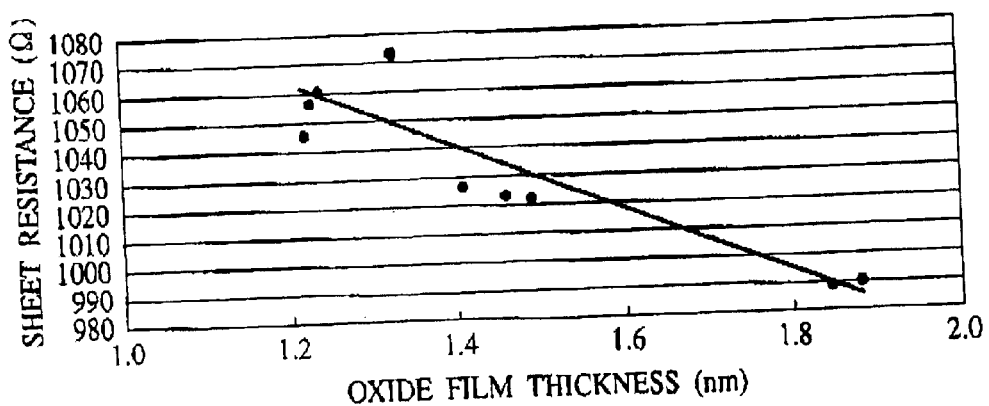
FIG. 5 is a graph of relationships between the film thickness of the chemical oxide film and the sheet resistance thereof.

Then, a 5 nm-thickness silicon oxide film 30 is formed on the entire surface by, e.g., CVD (see FIG. 4A).

Then, the silicon oxide film 30 anisotropically etched by, e.g., RIE (Reactive Ion Etching) to form the sidewall insulation films 16 on the side walls of the gate electrode 14. At this time, the chemical oxide film 28 is removed (see FIG. 4B).

Figure 4C:
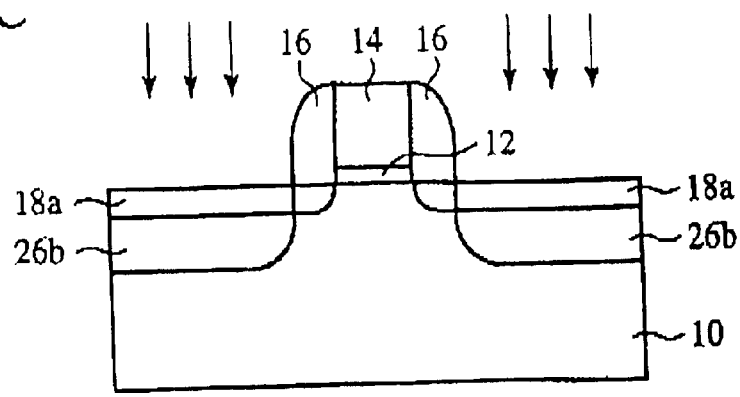

Next, with the gate electrode 14 and the sidewall insulation film 16 as a mask, boron is ion implanted to form a doped region 26b which is to be the heavily doped diffused layer 18b of the LDD structure (see FIG. 4C). Conditions for the ion implantation are can be, e.g., a 0.5–20 keV ion acceleration energy and a $1 \times 10^{14} - 1 \times 10^{15}$ $cm^{-2}$ dose.

Then, the dopant in the doped region 26b is activated by the thermal processing using, e.g., RTA. Conditions for the thermal processing using RTA can be, e.g., a 1000° C. heating temperature and a 10–30 second heating time. The dopant in the doped region 26b is thus activated to thereby form the heavily doped diffused layer 18b, and the source/drain diffused layer 20 of the LDD structure is formed of the lightly doped diffused layer 18a and the heavily doped diffused layer 18b.

Thus, the semiconductor device shown in FIG. 1 is fabricated.

As described above, according to the present embodiment, the chemical oxide film 28 is formed on the doped region 26a of the silicon substrate 10, and the dopant in the doped region 26a is activated by the thermal processing using RTA, whereby the out diffusion of the dopant can be suppressed. Resultantly, the low resistance and the resistance value stability of the lightly doped diffused layer 18a can be attained. Thus the semiconductor device of high reliability can be provided.

The thermal processing using RTA is performed in an atmosphere containing no oxygen, whereby the generation of bird's beaks in the gate electrode 14 area can be suppressed. The semiconductor device of higher stability can be provided.

The step of removing the resist film 24 is also for forming the chemical oxide film 28, which does not increase a step number nor makes the semiconductor fabrication process complicated.

In the present embodiment, the chemical oxide film 28 is grown when the resist film 24 is removed. However, the chemical oxide film 28 may be grown after the resist film 24 has been removed. In this case, the resist film 24 is removed by sequentially uninterruptedly performing the ashing processing, the SPM processing and the low temperature APM processing or by using, e.g., organic resist removing liquid, and then the oxidizing processing using high temperature APM and the oxidizing processing using HPM may be sequentially uninterruptedly performed. The oxidizing processing using APM and the oxidizing processing using an aqueous solution of ozone may be sequentially uninterruptedly performed. The oxidizing processing using SPM and the oxidizing processing using HPM may be sequentially uninterruptedly performed. The oxidizing processing using SPM and the oxidizing processing using nitric acid may be sequentially uninterruptedly performed. The oxidizing processing using SPM and the oxidizing processing using aqueous solution of ozone may be sequentially uninterruptedly performed. The oxidizing processing aqueous solution of ozone alone may be performed.

(Evaluation Result)

The p-channel MOS transistor fabricated by the method for fabricating a semiconductor device according to the present embodiment was measured about the resistance of the lightly doped diffused layer to be compared for evaluation.

Figure 6:
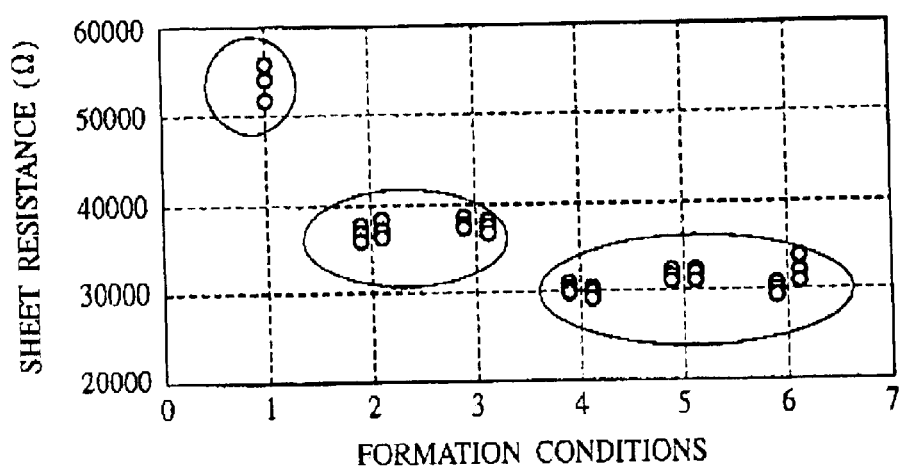
FIG. 6 is a graph of the evaluation results.

FIG. 6 is a graph of relationships between conditions for forming the chemical oxide film and measured resistance values of the lightly doped diffused layer. The formation conditions of the chemical oxide film are taken on the horizontal axis, and the resistance values of the lightly doped diffused layer.

In Formation Condition 1, the APM processing was performed after the plasma ashing to form the chemical oxide film of a 1.2 nm-thickness. The respective measured points in the round circle on the upper left in the graph were measured results of Formation Condition 1.

In Formation Conditions 2 and 3, the oxidizing processing with SPM was performed after the plasma ashing to form the chemical oxide film in a 1.4 nm-thickness.

The respective measured points in the ellipse near the center of the graph are measured results of Formation Conditions 2 and 3.

In Formation Conditions 4 to 6, a first oxidizing processing using SPM, the plasma ashing and a second oxidizing processing using SPM were sequentially uninterruptedly performed to form the chemical oxide film in a 1.6 nm-thickness. The respective measured points in the ellipse on the lower right in the graph are the measured results of Formation Conditions 4 to 6.

In the case of the 1.2 nm-thickness chemical oxide film formed under Formation Conditions 1, the resistance values of the lightly doped diffused layer are high. Even under the same conditions, the values vary among the respective measured points. This will be because the chemical oxide film of the small thickness cannot sufficiently suppress the out diffusion of the dopant.

In the cases of the 1.4 nm-thickness chemical oxide film and the 1.6 nm-thickness chemical oxide film formed under Formation Conditions 2 to 6, the resistance values of the lightly doped diffused layers are lower in comparison with those of the chemical oxide film of the 1.2 nm-thickness and stably do not vary among the respective measured points. In comparison with the chemical oxide film of the 1.4 film thickness formed under Formation Conditions 2 and 3 with the chemical oxide film of the 1.6 nm-thickness formed under Formation Conditions 4 to 6, the latter makes the resistance value smaller and makes the variations of the resistance value smaller among the respective measured points.

As described above, the film thickness and the film forming conditions of the chemical oxide film to be formed on the doped region which is to be the lightly doped diffused layer are suitably set, whereby the resistance value of the lightly doped diffused layer can be made low, and the variation of the resistance value can be made small.

[Modified Embodiment]

The present invention is not limited to the above-described embodiment and can cover other various modifications.

For example, in the above-described embodiment, a p type MOS transistor is fabricated, but the present invention is applicable to n type MOS transistor, and can suppress the out diffusion of not only boron but also various dopants, such as phosphorus, arsenic, etc.

In the above-described embodiment, the gate electrode formed of a polysilicon single layer structure was explained. However, gate electrodes of the polymetal structure and gate electrodes of the polycide structure of the layer film of polysilicon film and silicide film may be formed.

In the above-described embodiment, the chemical oxide film 28 is formed, but in place of the chemical oxide film 28, a silicon oxide film of an about 10 nm-thickness may be formed on the doped region 26a by CVD. The silicon oxide film formed by CVD can also suppress the out diffusion of the dopant as can the chemical oxide film 28. In this case, the silicon oxide film is formed on the doped region 26a by CVD after the gate electrode 14 has been formed. Conditions for forming the film can be, e.g., $SiH_2Cl$ and $N_2O$ as raw material gases and 400° C. film forming temperature. Preferably, the film forming temperature is as low as 250–500° C. Such low film forming temperature can suppress the generation of bird's beaks at the gate electrode 14 area when the silicon oxide film is formed on the doped region 26a.

What is claimed is:

1. A method for fabricating a semiconductor device comprising the steps of:
    forming a gate electrode on a semiconductor substrate with a gate insulation film formed therebetween;
    patterning the conductor layer with a resist film as a mask to form a gate electrode;
    implanting a dopant in the semiconductor substrate with the gate electrode and the resist film as a mask to form a doped region in the semiconductor substrate;

removing the resist film with an atmosphere;

forming a chemical oxide film on the doped region sufficient to prevent the dopant implanted in the doped region from diffusing outside the semiconductor substrate; and performing thermal processing for activating the dopant implanted in the doped region, the step of removing the resist film also forms the chemical oxide film, in that the atmosphere for removing the resist film also oxidizes a surface of the doped region to form the chemical oxide film.

2. A method for fabricating a semiconductor device according to claim 1, wherein in the step of forming the chemical oxide film, the chemical oxide film of a 1.4 nm-thickness or above is formed.

3. A method for fabricating a semiconductor device according to claim 2, wherein in the step of the performing thermal processing, the thermal processing is performed in an atmosphere containing no oxygen.

4. A method for fabricating a semiconductor device according to claim 2, wherein the atmosphere is at least any one of plasmas containing oxygen, oxygen radicals and a chemical liquid.

5. A method for fabricating a semiconductor device according to claim 1, wherein in the step of the performing thermal processing, the thermal processing is performed in an atmosphere containing no oxygen.

6. A method for fabricating a semiconductor device according to claim 5, wherein the atmosphere is at least any one of plasmas containing oxygen, oxygen radicals and a chemical liquid.

7. A method for fabricating a semiconductor device according to claim 1, wherein the atmosphere is at least any one of plasmas containing oxygen, oxygen radicals and a chemical liquid.

8. A method for fabricating a semiconductor device according to claim 7, wherein the chemical liquid is sulfuric acid/hydrogen peroxide mixture, ammonia/hydrogen peroxide mixture, hydrochloric acid/hydrogen peroxide/water mixture, an aqueous solution of ozone or nitric acid.

9. A method for fabricating a semiconductor device according to claim 1, wherein in the step of performing the thermal processing, the thermal processing is performed by RTA.

* * * * *